(12) United States Patent
Frazier et al.

(10) Patent No.: US 8,451,070 B2
(45) Date of Patent: May 28, 2013

(54) SELF-POWERED MICROELECTROMECHANICAL OSCILLATOR

(75) Inventors: Gary A. Frazier, Garland, TX (US); Cody B. Moody, Frisco, TX (US); Brandon W. Pillans, Plano, TX (US)

(73) Assignee: Raytheon Company, Waltham, MA (US)

( * ) Notice: Subject to any disclaimer, the term of this patent is extended or adjusted under 35 U.S.C. 154(b) by 33 days.

(21) Appl. No.: 12/878,758

(22) Filed: Sep. 9, 2010

(65) Prior Publication Data

US 2012/0062328 A1 Mar. 15, 2012

(51) Int. Cl.
*H02N 1/00* (2006.01)
*H02N 2/18* (2006.01)
*H01L 41/08* (2006.01)
*H04Q 5/22* (2006.01)

(52) U.S. Cl.
USPC ........... 331/154; 310/309; 310/303; 340/10.1

(58) Field of Classification Search
USPC .................... 331/154, 155, 156, 116 M, 165, 331/185, 65, 66; 310/301, 302, 303, 304, 310/305, 309; 340/10.1
See application file for complete search history.

(56) References Cited

U.S. PATENT DOCUMENTS

| | | | |
|---|---|---|---|
| 6,479,920 B1 * | 11/2002 | Lal et al. .................. | 310/309 |
| 6,791,441 B2 | 9/2004 | Pillans et al. | |
| 6,803,534 B1 | 10/2004 | Chen et al. | |
| 7,002,441 B2 | 2/2006 | Pillans et al. | |
| 7,301,254 B1 | 11/2007 | Lal et al. | |
| 7,474,171 B2 | 1/2009 | Morris | |
| 2007/0107502 A1* | 5/2007 | Degertekin ................ | 73/105 |
| 2007/0125150 A1* | 6/2007 | Stievater et al. ........... | 73/1.79 |
| 2007/0295064 A1* | 12/2007 | Degertekin et al. ......... | 73/105 |
| 2009/0301196 A1* | 12/2009 | Wang et al. ............... | 73/579 |
| 2011/0133903 A1* | 6/2011 | Alsafadi .................. | 340/10.4 |
| 2011/0241839 A1* | 10/2011 | Lal et al. ................. | 340/10.1 |

OTHER PUBLICATIONS

Koev, et al., "A Microcantilever Sensor With Integrated Optical Readout for Antimicrobial Drug Discovery", Transducers 2009, Jun. 21-25, 2009, pp. 722-725.*
Koev, et. al., "Interferometric readout of multiple cantilever sensors in liquid samples." Sensors and Actuators B: Chemical 146.1, Apr. 2010, pp. 245-252.*

* cited by examiner

*Primary Examiner* — Ryan Johnson
(74) *Attorney, Agent, or Firm* — Christie, Parker & Hale, LLP

(57) ABSTRACT

Self powered microelectromechanical oscillators are provided for various applications. In one embodiment, the invention relates to a self powered microelectromechanical tagging or sensing system including a microelectromechanical oscillator having a characteristic frequency, the oscillator including a first substrate having a radioactive material configured to emit electrons, and a second substrate, spaced apart from the first substrate by first and second ends supported at spaced locations on the first substrate, where the second substrate includes a flexible material and is configured to collect the electrons emitted from the first substrate, and move toward the first substrate from a default position to an actuated position when a sufficient number of electrons have been collected, where, in the actuated position, collected electrons are transferred from the second substrate to the first substrate, and a circuitry configured to receive, from the oscillator by wireless communication, information indicative of the characteristic frequency of the oscillator.

19 Claims, 5 Drawing Sheets

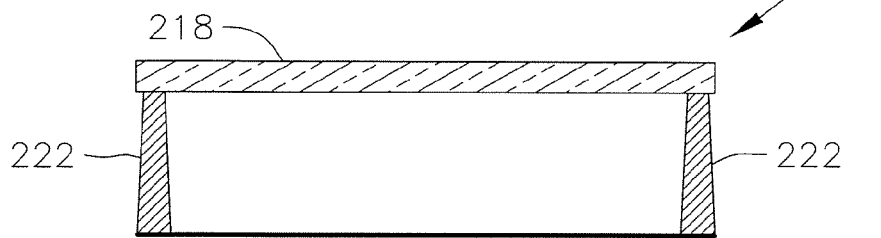
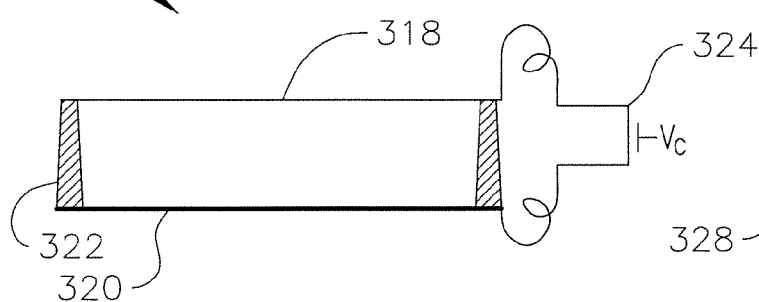
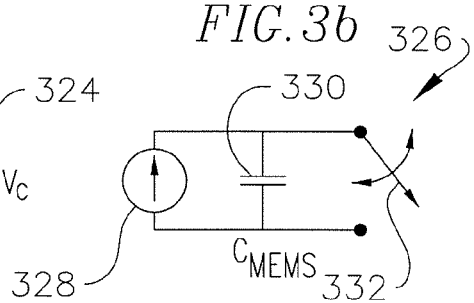
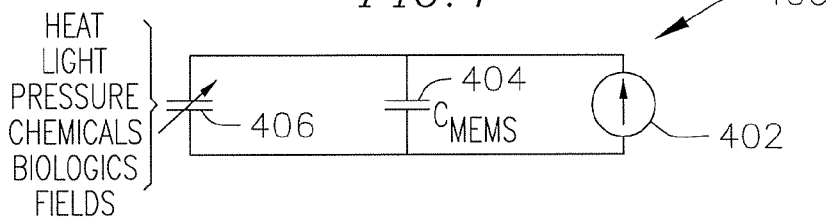
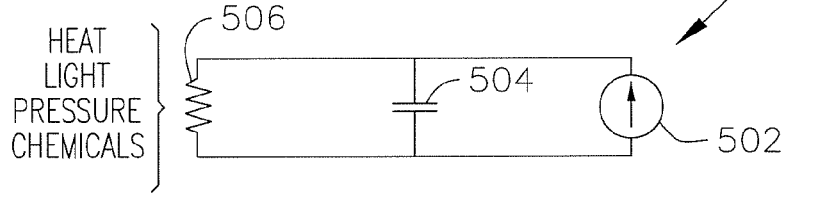
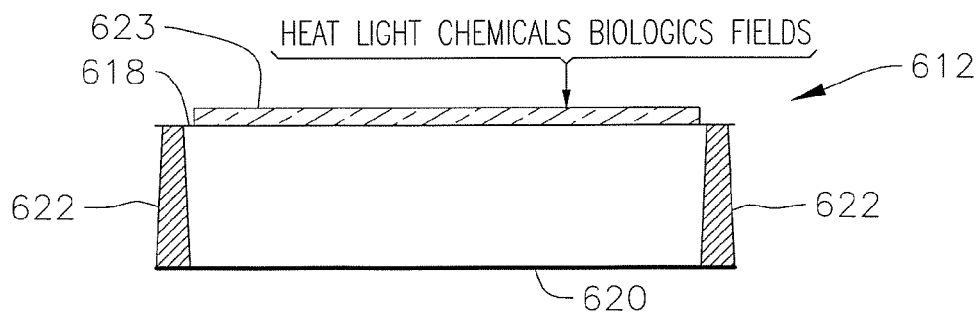

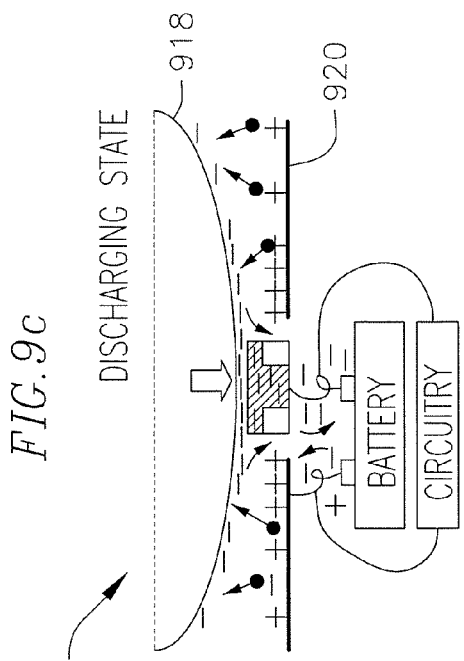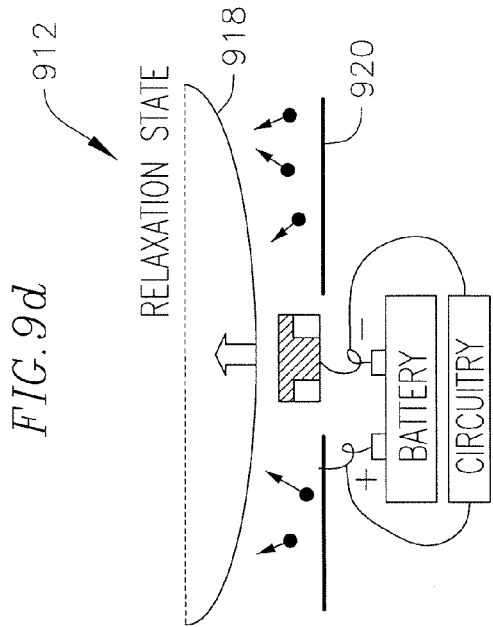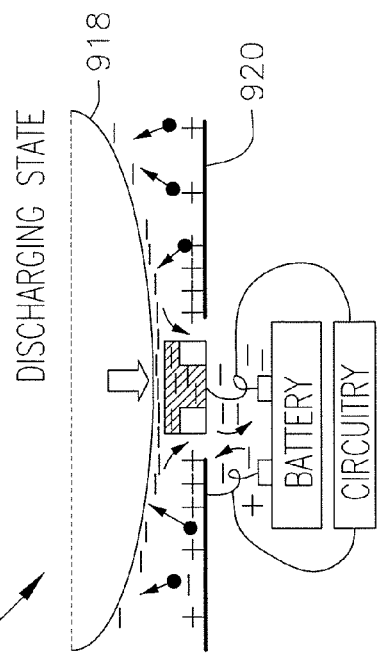

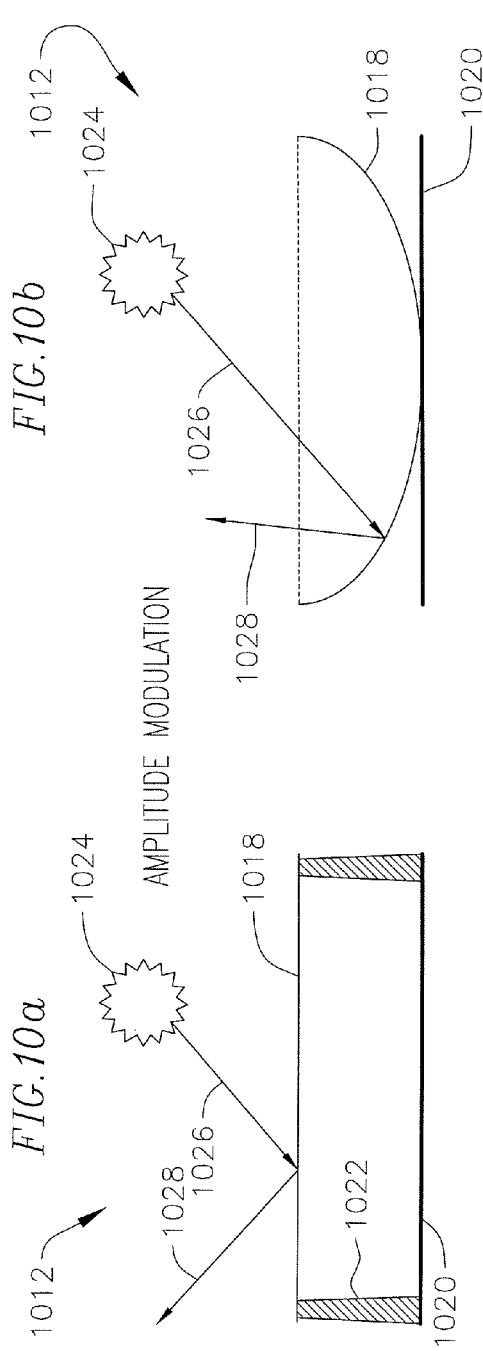
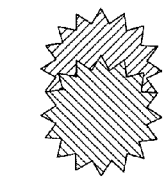
FIG.10a
FIG.10b
AMPLITUDE MODULATION
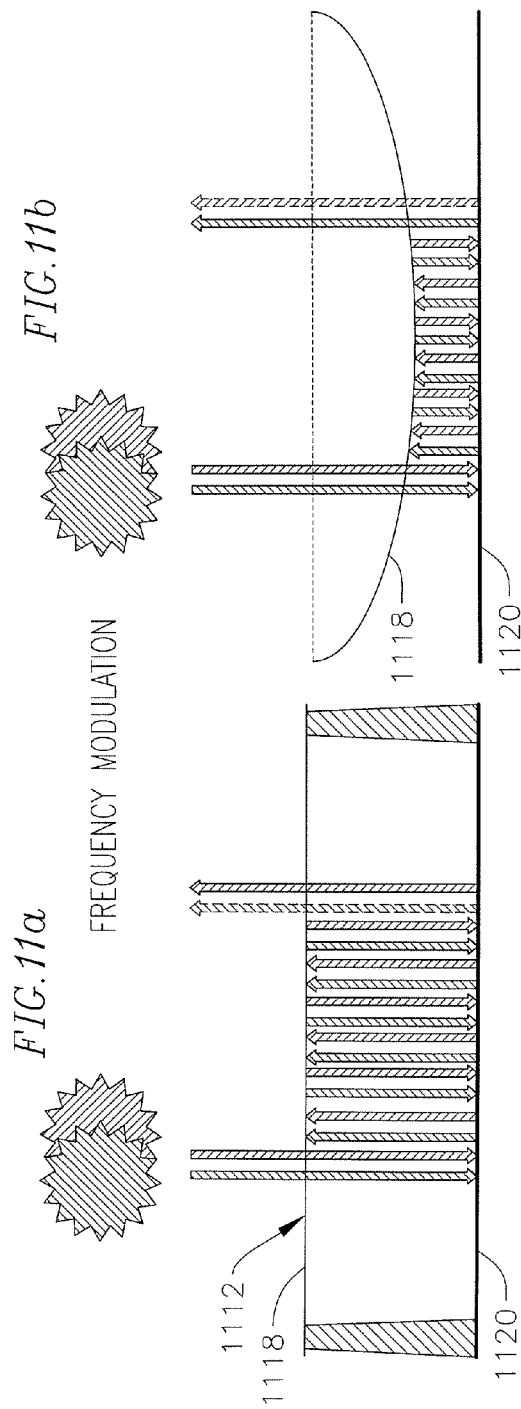
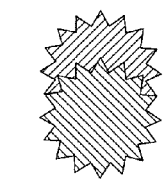
FIG.11a
FIG.11b
FREQUENCY MODULATION

SELF-POWERED MICROELECTROMECHANICAL OSCILLATOR

FIELD

The present invention relates generally to microelectromechanical (MEMS) devices, and more specifically, to MEMS oscillators used for optical light modulation, remote sensing, and electronic frequency determining circuits.

BACKGROUND

It may be generally useful to provide a system and method that generates periodic movement of a mechanical device. Examples include pendulums, tuning forks, quartz crystal resonators and the like. The oscillating structures can be used as frequency determining devices in electronic circuits. A quartz crystal may be fitted with electrodes so that mechanical vibrations in the crystal may be amplified by an electronic feedback amplifier to produce sustained oscillations at a frequency set by the geometry of the crystal. MEMS systems have been used to provide micrometer-scale mechanical resonators for the same purpose. Cantilevers and drumheads can be manufactured and coupled to electronic feedback amplifiers so that the characteristic mechanical resonant frequency of the MEMS structure determines the oscillation frequency of the electronic circuit.

These techniques for providing a fixed frequency oscillator are well known and often applied to today's communications and timekeeping equipment. However, these circuits must be provided with electrical power to overcome the energy lost in the circuit due to the unavoidable losses inherent in electronic oscillator circuits. This need to electrically power these circuits is a disadvantage in applications where the available electrical power is small or non-existent. It would be advantageous to provide oscillators which operate without the need for external electrical power or other circuitry to establish and maintain oscillation at a characteristic frequency.

SUMMARY

Aspects of the invention relate to a self powered microelectromechanical MEMS device that can be used for optical light modulation, remote sensing, electronic frequency determining circuits and other applications.

In one embodiment, the system may include a radioactive isotope and MEMS structure that provides a periodic deflection of a metallic membrane without the assistance of an electronic circuit or the need for external operating power. The radioactive isotope can electrically power the device and surrounding circuitry. The system can be applied to optical light modulation, remote sensing, and electronic frequency determining circuits.

In some embodiments, the invention relates to a self powered microelectromechanical tagging or sensing system including a microelectromechanical oscillator having a characteristic frequency, the oscillator including a first substrate having a radioactive material configured to emit electrons, and a second substrate, spaced apart from the first substrate by first and second ends supported at spaced locations on the first substrate, where the second substrate includes a flexible material and is configured to collect the electrons emitted from the first substrate, and move toward the first substrate from a default position to an actuated position when a sufficient number of electrons have been collected, where, in the actuated position, a plurality of the collected electrons are transferred from the second substrate to the first substrate, and a circuitry configured to receive, from the oscillator by wireless communication, information indicative of the characteristic frequency of the oscillator. In one embodiment, the transfer of collected electrons from the second substrate to the first substrate thereby releases an electrostatic force and because of the intrinsic stress in the flexible material of the second substrate, the second substrate returns to its original, non-deflected state. In such case, this deflection and relaxation of the second substrate sets the characteristic frequency of the device.

In yet other embodiments, a self powered microelectromechanical tagging or sensing system including a microelectromechanical oscillator having a characteristic frequency, the oscillator including a first substrate including a radioactive material configured to emit electrons; and a second substrate, spaced apart from the first substrate by first and second ends supported at spaced locations on the first substrate, where the second substrate includes a flexible material and is configured to: collect the electrons emitted from the first substrate, and move toward the first substrate from a default position to an actuated position when a sufficient number of electrons have been collected, and an electrode positioned between the first substrate and the second substrate, where, in the actuated position, a plurality of the collected electrons are transferred from the second substrate to the electrode, and a circuitry configured to receive, from the oscillator by wireless communication, information indicative of the characteristic frequency of the oscillator. In one such embodiment, the transfer of collected electrons from the second substrate to the first substrate thereby releases an electrostatic force and because of the intrinsic stress in the flexible material of the second substrate, the second substrate returns to its original, non-deflected state. In such case, this deflection and relaxation of the second substrate sets the characteristic frequency of the device.

In still yet other embodiments, the invention relates to a self powered microelectromechanical tagging or sensing system including a self powered microelectromechanical oscillator having a characteristic frequency, the oscillator including a first substrate, and a second substrate, spaced apart from the first substrate by first and second ends supported at spaced locations on the first substrate, where the second substrate includes a flexible radioactive material configured to emit electrons, where the first substrate is configured to collect the emitted electrons, where the second substrate is configured to move toward the first substrate from a default position to an actuated position when a sufficient number of electrons have been collected by the first substrate, where, in the actuated position, a plurality of the collected electrons are transferred from the first substrate to the second substrate, and a circuitry configured to receive, from the oscillator by wireless communication, information indicative of the characteristic frequency of the oscillator. In one such embodiment, the transfer of collected electrons from the second substrate to the first substrate thereby releases an electrostatic force and because of the intrinsic stress in the flexible material of the second substrate, the second substrate returns to its original, non-deflected state. In such case, this deflection and relaxation of the second substrate sets the characteristic frequency of the device.

BRIEF DESCRIPTION OF THE DRAWINGS

FIG. 2 is a schematic cross sectional diagram of a self-powered microelectromechanical oscillator having a moveable membrane made of a transparent material in accordance with one embodiment of the invention.

FIG. 3a is a schematic cross sectional diagram of a self-powered microelectromechanical oscillator having a switch coupled between a flexible membrane layer and a nuclear substrate layer in accordance with one embodiment of the invention.

FIG. 3b is a schematic circuit diagram of a model of the self-powered microelectromechanical oscillator of FIG. 3a in accordance with one embodiment of the invention.

FIG. 4 is a schematic circuit diagram of a model of a self-powered microelectromechanical oscillator coupled with a capacitive environmental sensor in accordance with one embodiment of the invention.

FIG. 5 is a schematic circuit diagram of a model of a self-powered microelectromechanical oscillator coupled with a resistive environmental sensor in accordance with one embodiment of the invention.

FIG. 6 is a schematic cross sectional diagram of a self-powered microelectromechanical oscillator with a flexible membrane having a reactive coating for sensing environmental characteristics in accordance with one embodiment of the invention.

FIG. 9a is a schematic cross sectional diagram of a self-powered microelectromechanical oscillator having a flexible membrane layer opposite of a nuclear substrate layer and an electrode positioned between the layers to collect charge and store it in a battery in accordance with one embodiment of the invention.

FIG. 9b is a schematic cross sectional diagram of the self-powered microelectromechanical oscillator of FIG. 9a in a charging or actuation state in accordance with one embodiment of the invention.

FIG. 9c is a schematic cross sectional diagram of the self-powered microelectromechanical oscillator of FIG. 9a in a discharging state in accordance with one embodiment of the invention.

FIG. 9d is a schematic cross sectional diagram of the self-powered microelectromechanical oscillator of FIG. 9a in a relaxation or de-actuation state in accordance with one embodiment of the invention.

FIGS. 10a-10b are schematic cross sectional diagrams of a self-powered microelectromechanical oscillator illustrating an amplitude modulation method of interrogating the state of the oscillator in accordance with one embodiment of the invention.

FIG. 11a-11b are schematic cross sectional diagrams of a self-powered microelectromechanical oscillator illustrating a frequency modulation method of interrogating the state of the oscillator in accordance with one embodiment of the invention.

DETAILED DESCRIPTION

Figure 1A:
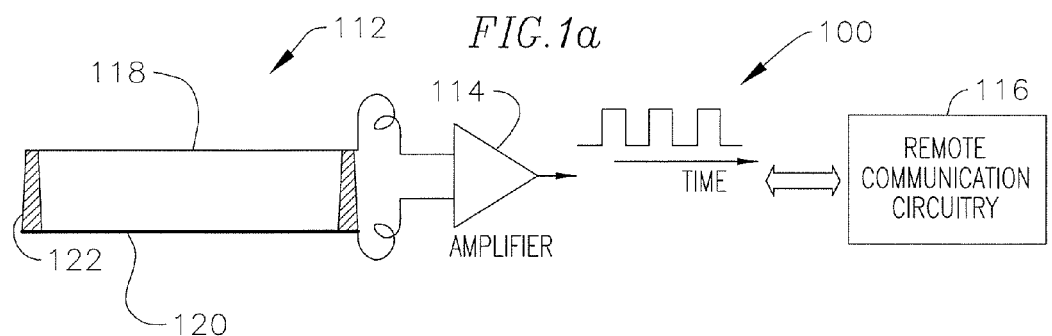
FIG. 1a is a schematic cross sectional diagram of a self-powered microelectromechanical oscillator having a flexible membrane layer and a nuclear substrate layer where the oscillator is coupled to an amplifier and is in communication with remote communication circuitry in accordance with one embodiment of the invention.

Referring now to the drawings, embodiments of the self powered microelectromechanical oscillators are powered by the materials that make up the MEMS structure. When used as a light modulator some aspect of the mechanical structure is presentable to incident light so that reflected light is modulated at the characteristic frequency of the MEMS oscillator. When used as a frequency determining device the mechanical oscillator is fitted with electrodes so that an external circuit can be excited at the characteristic frequency of the MEMS oscillator. Arrays of MEMS oscillators may be arranged to provide more than one characteristic frequency.

In some embodiments, self powered microelectromechanical oscillators are used in microelectromechanical tagging or sensing systems that include at least one self powered microelectromechanical oscillator having a characteristic frequency and in wireless communication with remote circuitry configured to receive information indicative of the characteristic frequency of the oscillator. In several embodiments, the remote circuitry interrogates the oscillator to facilitate the receipt of information indicative of the characteristic frequency of the oscillator. The self powered microelectromechanical oscillator includes a first substrate including a radioactive material configured to emit electrons and a second substrate spaced apart from the first substrate by a preselected distance and including a flexible material. The second substrate is configured to collect the emitted electrons and to bend towards the first substrate when a sufficient number of electrons have been collected.

In some embodiments, the self powered microelectromechanical oscillator is coupled to an amplifier converting mechanical oscillations of the oscillator into electronic oscillations. In one such case, the electronic oscillations are transmitted to the remote circuitry using a transmitter. In another such embodiment, the self powered MEMS oscillator drives the electronic amplifier without the need to receive the energy normally required to maintain oscillation. In such case, no feedback would be required in the connected circuitry since oscillations would already be provided by the MEMS structure.

In another embodiment, the second substrate includes a transparent material whereby the self powered microelectromechanical oscillator forms a resonator and can be interrogated using light. In one embodiment, a switch is coupled between the first substrate and the second substrate to turn the self powered microelectromechanical oscillator on and off. In another embodiment, an external capacitor sensitive to one or more environmental conditions is coupled to the self powered microelectromechanical oscillator to form a sensor circuit. In another embodiment, an external resistor sensitive to one or more environmental conditions is coupled to the self powered microelectromechanical oscillator to form a sensor circuit. In another embodiment, a reactive coating sensitive to one or more environmental conditions is deposited on the flexible membrane of the self powered microelectromechanical oscillator to form a sensor circuit.

In some embodiments, the MEMS oscillators have structures that exhibit substantial movement in concert with the oscillations whereby light reflected off of these moving members would be modulated in amplitude, phase, or direction at the same frequency as the oscillations. Thus light energy could be modulated by the action of a MEMS oscillator without the need to provide electrical power to the structure. Such devices could be useful as a tag where the modulations of light emitted from a remote source could be detected and processed to determine the frequency of the MEMS oscillator. If the oscillation frequency represented unique information then the interrogator could identify the specific MEMS oscillator from the modulation frequency impressed upon the reflected illumination. A set of MEMS oscillators set to have unique oscillation frequencies could be gathered in a single tag system so that incident light would be modulated by a set of fixed frequencies. Processing of the light reflected from a set of MEMS oscillators could be used to encode multiple bits of information onto the reflected light signal.

FIG. 1a is a schematic cross sectional block diagram of a self-powered microelectromechanical oscillator (SPOMO) having a flexible membrane layer and a nuclear substrate layer where the oscillator is coupled to an amplifier and is in communication with remote communication circuitry in accordance with one embodiment of the invention. The system SPOMO 110 includes the SPOMO 112 coupled to the amplifier 114 and in communication with the remote circuitry 116. The SPOMO 112 includes the flexible membrane substrate 118 and the nuclear substrate 120 spaced apart from one another by spacer walls 122. The flexible membrane substrate 118 and the nuclear substrate 120 can be made of metallic materials and thereby act as electrodes. The input to the amplifier 114 is coupled to these electrodes and used to amplify the electrical voltage that appears across the SPOMO 112. As electric charge builds up on the membrane 118, a growing potential difference may be amplified and used to drive other electronic circuits. Thus, the mechanical oscillations of the device may be converted into electrical alternating current at the same frequency through the use of the amplifier. In other embodiments, the electrodes may be attached to a variety of other circuits such as logic gates, flip-flops, phase-locked loops, analog-to-digital converters, and the like.

As can be seen in FIG. 1a, the SPOMO 112 includes two ostensibly parallel electrodes, in the form planar substrates, composed of a first moveable metallic membrane 118 situated over a second deposited film of electrically-conductive radioactive material 120 such as Strontium 90. The space between the membrane and nuclear isotope may be either a vacuum or filled with an inert gas. In normal operation, electrons will be emitted spontaneously by the radioactive layer. Some of these electrons will impact and be absorbed by the metallic membrane. This charging process produces a net negative electrical charge on the membrane and a net positive electrical charge on the nuclear material.

Figure 1B:
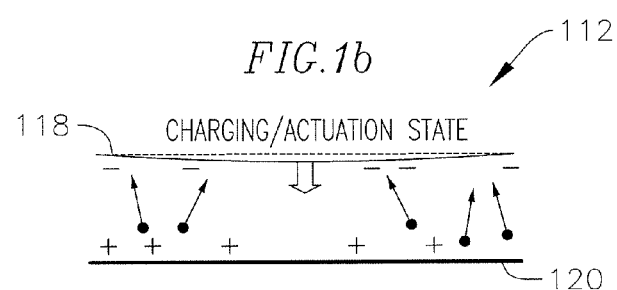
FIG. 1b is a schematic cross sectional diagram of the self-powered microelectromechanical oscillator of FIG. 1a in a charging or actuation state in accordance with one embodiment of the invention.

FIG. 1b is a schematic cross sectional diagram of the self-powered microelectromechanical oscillator of FIG. 1a in a charging or actuation state in accordance with one embodiment of the invention. The separated charge will produce an electrical force between the membrane and the nuclear material. As radioactive decay continues the electric force between the membrane and nuclear film will increase until the membrane's restoring force is greater than the electrical force. Under these conditions the membrane will be mechanically deflected toward the nuclear material. This deflection will continue until the membrane and nuclear material come into near or actual contact whereupon the electrons on the membrane will flow back into the nuclear material and neutralize the accumulated positive charge in a discharging state.

Figure 1C:
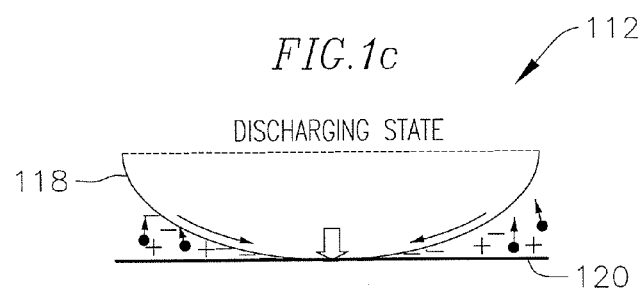
FIG. 1c is a schematic cross sectional diagram of the self-powered microelectromechanical oscillator of FIG. 1a in a discharging state in accordance with one embodiment of the invention.

FIG. 1c is a schematic cross sectional diagram of the self-powered microelectromechanical oscillator of FIG. 1a in a discharging state in accordance with one embodiment of the invention. Once electrically neutral the membrane will return to its normal undeflected state through the action of the normal restoring forces associated with the deflected membrane in a relaxation state.

Figure 1D:
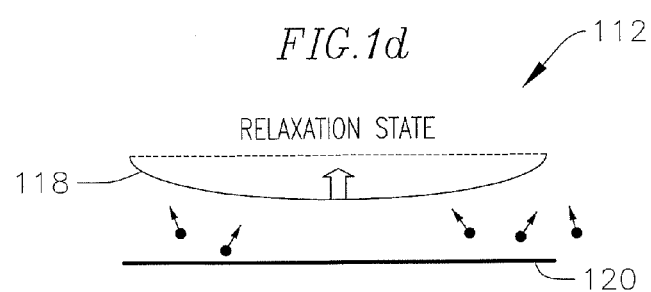
FIG. 1d is a schematic cross sectional diagram of the self-powered microelectromechanical oscillator of FIG. 1a in a relaxation or de-actuation state in accordance with one embodiment of the invention.

FIG. 1d is a schematic cross sectional diagram of the self-powered microelectromechanical oscillator of FIG. 1a in a relaxation or de-actuation state in accordance with one embodiment of the invention. The process illustrated in FIGS. 1a-1d will repeat in a periodic fashion until the nuclear material in the system is consumed. For some materials such as Strontium 90 this time can be more than 20 years. Thus a moveable membrane and nuclear decay may be combined to provide a mechanical oscillator where the moveable membrane periodically deflects at a characteristic frequency.

The electrical voltage required to deflect a metallic membrane can vary from a few volts to hundreds of volts depending upon the materials used to form the membrane and thickness and topology of the membrane. It is generally required that the energy (in electron volts) of the emitted radioactive charge be greater than the voltage required to deflect the membrane. Otherwise electrical charges will not build up upon the membrane to a sufficient level to deflect the membrane. Typical nuclear decay energies are in the range of 5,000 to 5,000,000 electron volts. Thus, it is the case that most radioactive species will have sufficient energy to exit the nuclear material, transit to the membrane, and reside on the membrane even as the electric field builds up between the two electrodes. The frequency of oscillation of the SPOMO is determined by the tension in the moveable membrane electrode and the rate of radioactive decay (measured in Curies) of the radioactive counter electrode.

The moveable membrane may be composed of a variety of materials including metals such as gold or aluminum. The topology of the membrane may be adjusted for each application. For example, the membrane may be constructed to be planar and mirror-like in finish so that light, reflected off of the membrane, will be modulated in amplitude, phase, or direction by the motion of the membrane.

FIG. 2 is a schematic cross sectional diagram of a self-powered microelectromechanical oscillator 212 having a moveable membrane 218 made of a transparent material in accordance with one embodiment of the invention. The SPOMO 212 further includes a substrate 220 comprising nuclear material spaced apart form the moveable membrane 218 by spacers 222.

The moveable membrane 218 may be composed of a bi-layer of materials where the layer closest to the nuclear material layer 220 is made electrically conducting but partially transparent and the layer furthest from the nuclear layer is optically clear and non-conductive. In one embodiment, the bi-layer includes 200 Angstroms of aluminum and a 2000 Angstrom layer of sapphire. The optically clear layer is used to control the mechanical properties of the membrane and the electrically conducting layer is used to capture and hold radioactive charge emitted from the nuclear material. In this embodiment light incident upon the membrane will be transmitted through the membrane and fall upon the nuclear material. If this layer is made planar and mirror-like then light will be reflected from the nuclear material and again partially pass through the membrane. Through the process of multiple internal reflections between the membrane and nuclear material a standing wave will be established such that only light of certain wavelengths will be efficiently reflected from the SPOMO.

The technology of multi-layer optical interference filters and optical Fabry-Perot resonators is well known. The embodiment illustrated in FIG. 2 can provide a Fabry-Perot reflective resonator where the characteristic frequency of reflected light is a function of the distance between the membrane and layer of nuclear material. It is seen that the periodic motion of the membrane will periodically modulate the characteristic frequencies of the reflected light. Thus this embodiment of the SPOMO may modulate the color of reflected light at a periodic rate related to the characteristic frequency of the mechanical oscillations of the membrane. Note that the frequency modulation effects will be a function of the absolute separation between the membrane and nuclear layer. One or more cycles of frequency shift (one or more optical interference fringes) may occur over one cycle of mechanical oscillation of the membrane.

A typical MEMS membrane of size 100 um×100 um may have a typical capacitance of 20 femtoFarads in the undeflected state and 200 femtoFarads in the state where the membrane just touches the nuclear material layer. A typical deflection voltage for such as device may be as low as 20 volts. The typical amount of charge required to build up 20 volts on a 200 fF capacitor is 4 picoCoulombs. This amounts to 25 million electrons. The radioactivity of the nuclear material can be made sufficient to provide this charge at the oscillation frequency of the membrane. For example, in one embodiment, if the membrane frequency is 20 kHz, then the radioactivity can be at least 5 times $10^{11}$ (100 billion) charges per second, or about 13 Curies. Using the same physical structure, the radioactivity required to produce oscillation at a 1 Hz rate would be 0.0007 Curies. Larger membranes may need proportionately less deflection voltage, and need a proportionately smaller radioactive flux to deflect the membrane at a specific rate.

Each membrane will have a rate of deflection that depends upon the rate of electrical charge buildup on its surface. This charge buildup is directly related to the rate of radioactive decay in the nuclear layer. When the membrane is deflected and finally neutralized by charge recombination, the membrane will spring back to its equilibrium state. The membrane itself has a mechanical resonant frequency and the vibratory motion of the membrane may be damped, critically damped, or under-damped depending upon the pressure and type of gas that may reside between the membrane and the nuclear layer. If the space between the membrane and nuclear layer is a vacuum then the restoration of the membrane to its planar state can be characterized by underdamped mechanical oscillations. These oscillations can also modulate the reflectivity and terminal electrical capacitance of the system. These oscillations may range from a few kilohertz to less than 1 gigahertz. Thus, it is possible to have a rate of steady state mechanical oscillations set by the nuclear decay rate and a second characteristic frequency set by the intrinsic properties of the membrane.

In some embodiments, it may be preferred to have a very slow steady state oscillation frequency and a very high frequency of mechanical oscillation associated with the mechanical properties of the membrane. An example would be a system where the oscillation set by nuclear decay rate is on the order of 0.1 Hz (10 second period) and the mechanical resonance of the membrane is 100 KHz. Light incident upon such a membrane would experience very slow modulation over a 10 second time period plus a transient set of rapid oscillations during the time where the deflected membrane returns to its equilibrium state.

FIG. 3a is a schematic cross sectional diagram of a self-powered microelectromechanical oscillator 312 having a switch 324 coupled between a flexible membrane layer 318 and a nuclear substrate layer 320 in accordance with one embodiment of the invention. The electrical switch 324 is placed across the membrane 318 and nuclear layer 320 so that, when switched to the conducting state, insufficient electrical charge is allowed to build up upon the membrane. In this "on" switching state the radioactive charge collected by the membrane is continually returned to the nuclear material layer via the path provided by the switch. In the "off" state, the switch is effectively an open circuit and electrical charge will build up on the membrane in the manner described above. Thus, this switch, which itself may be controlled by a parasitic electronic circuit, provides a means to turn the mechanical oscillator on and off without the need to provide electrical power directly to the oscillator.

FIG. 3b is a schematic circuit diagram of a model 326 of the self-powered microelectromechanical oscillator 312 of FIG. 3a in accordance with one embodiment of the invention. The nuclear decay products are emitted from the nuclear material at random but at an approximately constant average rate. This charge emission is modeled as a constant current source 328. The membrane and nuclear layer are modeled as a simple capacitor 330 in parallel with the current source 328. In other embodiments, to be more precise, the capacitance of the membrane and nuclear layer may be modeled as having a value that is a function of the state of deflection of the membrane. The switch 332, which may be provided by a field effect or other transistor, may be modeled as a simple on-off switch that is controlled by an external bias voltage, Vc.

FIG. 4 is a schematic circuit diagram of a model of a self-powered microelectromechanical oscillator 400 coupled with a capacitive environmental sensor 406 in accordance with one embodiment of the invention. The model of the oscillator 400 includes a current source 402 representing the stream of charge emitted from the nuclear material coupled in parallel with capacitor 404 modeling the membrane and nuclear layer. The environmentally sensitive capacitor 406, in parallel with SPOMO or MEMs capacitor 404, is provided external to the SPOMO device so that the effective electrical capacitance between the membrane and nuclear layers is increased by the value of this external capacitor.

The rate of steady state oscillation of the membrane will then be set in part by the capacitance between the membrane and the nuclear layer (404) and also by the external capacitor 406. If this external capacitance 406 is altered by environmental effects such as humidity, temperature, different ambient chemicals, light, or other effects, then the frequency of the membrane oscillations will be related to the change of capacitance of this external sensor. Thus, environmental agents such as chemicals, heat, cold, light, pressure, and/or other characteristics can be remotely determined by measuring (by optical means) the changes in the frequency of membrane oscillations.

FIG. 5 is a schematic circuit diagram of a model of a self-powered microelectromechanical oscillator 500 coupled with a resistive environmental sensor 506 in accordance with one embodiment of the invention. The optically sensitive resistor 506 is placed across the SPOMO device so that the characteristic time constant of the resistor and the electrical capacitance between the membrane and nuclear layer (504) is a function of the intensity of light falling upon the resistor or alternatively upon some other environmental effect. The model of the oscillator 500 also includes current source 502 representing the stream of charge emitted from the nuclear layer coupled in parallel with capacitor 504 modeling the capacitance between the membrane and nuclear layer.

Similar to the embodiment of FIG. 4, if this external resistance 506 is altered by environmental effects such as humidity, temperature, different ambient chemicals, light, or other effects, then the frequency of the membrane oscillations will be related to the change of resistance of this external sensor. Thus, environmental agents such as chemicals, heat, cold, light, pressure, and/or other characteristics can be remotely determined by measuring (by optical means) the changes in the frequency of membrane oscillations.

In one embodiment, for example, the optically sensitive resistor 506 (e.g., photoconductor) may be made of a thin film of cadmium sulfide. In the dark state the photoconductor is essentially non-conducting. Under high illumination, the resistance of the photoconductor will fall to a low level. Electric charge that builds up upon the membrane will be returned to the nuclear layer through the photoconductor. This diverted charge will delay the rate at which charge builds up on the membrane. This will cause the rate of periodic deflection and discharge of the membrane to increase in proportion to the conductance of the photoconductor. At sufficient illumination the resistance of the photoconductor may fall to a level where the membrane never acquires a charge sufficient to deflect the membrane. Thus the oscillation of the membrane may be changed in rate or completely stopped depending upon the intensity of light falling upon the photoconductor.

In other embodiments, the photoconductor can be replaced by a sensor which has a resistance that is a function of the value of some sensed parameter such as heat, specific chemicals, pressure, biologics electrical and magnetic fields, and etc.

FIG. 6 is a schematic cross sectional diagram of a self-powered microelectromechanical oscillator 612 with a flexible membrane 618 having a reactive coating 623 for sensing environmental characteristics in accordance with one embodiment of the invention. The SPOMO 612 further includes a nuclear substrate layer 620 spaced apart from the flexible membrane 618 by spacers 622. The reactive coating 623 can be a material that reacts to the presence of various materials. For example, a membrane coated with a hydroscopic material will absorb moisture form the ambient air. The inertial mass of the membrane may thereby be altered and this mass increase will change the mechanical properties of the membrane. Since the periodic oscillation of the device is a strong function of the mechanical properties of the membrane, the oscillation rate will change according to the level of water taken up or released by the coating.

Other suitable coatings can be used also, such as those that are known to provide a change in inertial mass or tensile stress when gases or vapors are absorbed. Some layers may also change their level of internal stress with changes in temperature, level of electric field, or level of magnetic field. Thus, the embodiment of FIG. 6 provides a sensor can change the oscillation frequency of the device according to the value of a sensed environmental parameter.

Figure 7:
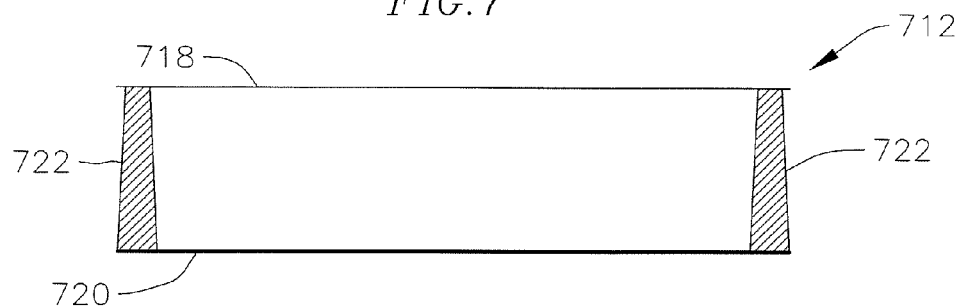
FIG. 7 is a schematic cross sectional diagram of a self-powered microelectromechanical oscillator having a flexible membrane made of radioactive materials and a base layer made of non-radioactive materials in accordance with one embodiment of the invention.

FIG. 7 is a schematic cross sectional diagram of a self-powered microelectromechanical oscillator 712 having a flexible membrane 718 made of radioactive materials and a base layer 720 made of non-radioactive materials in accordance with one embodiment of the invention. As compared to some of the previous embodiments, the position of the radioactive layer within the device is changed from the base layer to that of the membrane. The embodiment of FIG. 7 with the reversed substrate layers may be preferred for manufacturability. Usually the membrane layer is fabricated very late in the multistep process of assembly of the device. By making the membrane radioactive rather than the base layer, the process steps needed to integrate a radioactive element into the device are deferred until the device is nearly complete. As such the process of FIG. 7 may be advantageous since it may reduce the time that process personnel need to be exposed to nuclear materials.

Figure 8A:
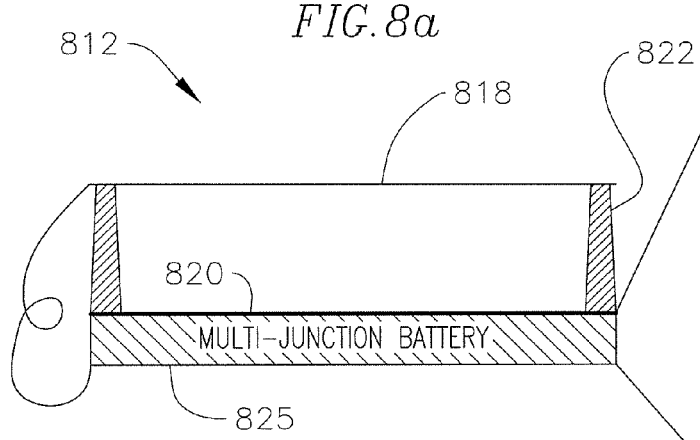
FIG. 8a is a schematic cross sectional diagram of a self-powered microelectromechanical oscillator having a nuclear substrate layer formed on top of a multi-layer substrate including multiple p-n junctions in accordance with one embodiment of the invention.

FIG. 8a is a schematic cross sectional diagram of a self-powered microelectromechanical oscillator 812 having a nuclear substrate layer 820 formed on top of a multi-layer substrate 825 including multiple p-n junctions in accordance with one embodiment of the invention.

Figure 8B:
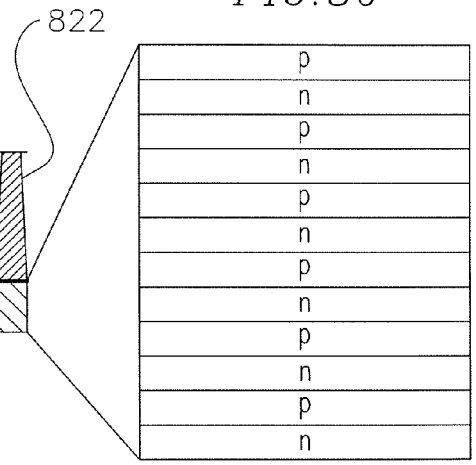
FIG. 8b is an exploded cross sectional view of the multi-layer p-n junction substrate of FIG. 8b in accordance with one embodiment of the invention.

FIG. 8b is an exploded cross sectional view of the multi-layer p-n junction substrate 825 of FIG. 8b in accordance with one embodiment of the invention.

Figure 8C:
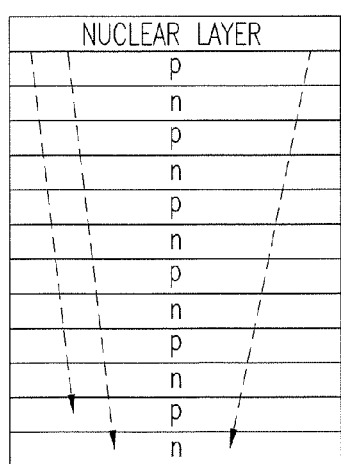
FIG. 8c is a cross sectional view of the multi-layer p-n junction substrate of FIG. 8b in accordance with one embodiment of the invention.

FIG. 8c is a cross sectional view of the multi-layer p-n junction substrate 825 of FIG. 8b in accordance with one embodiment of the invention.

Figure 8D:
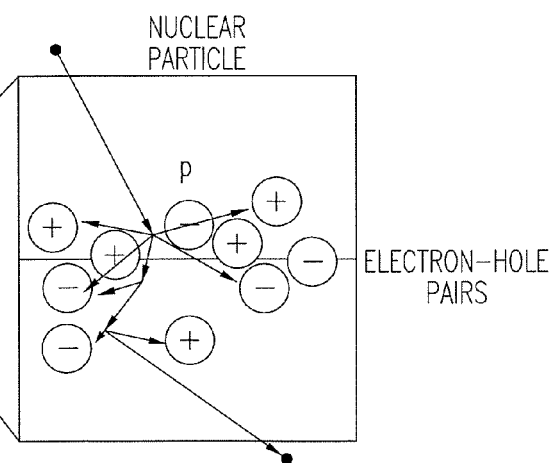
FIG. 8d is an exploded cross sectional view of two layers of the multi-layer p-n junction substrate of FIG. 8c illustrating the movement of charges within the substrate in accordance with one embodiment of the invention.

FIG. 8d is an exploded cross sectional view of two layers of the multi-layer p-n junction substrate of FIG. 8c illustrating the movement of charges within the substrate in accordance with one embodiment of the invention.

In the embodiment of FIG. 8a, the nuclear material 820 is formed on top of the multi-layer 825 of multiple semiconductor p-n junctions. A vertical heterostructure consisting of a plurality of p-n junctions is placed under the layer of nuclear material. Radioactive particles which leave the nuclear material and enter the multi junction will pass through the junctions and create electron-hole pairs as the charge collides and exchanges energy with the semiconductor lattice. As shown in FIGS. 8c and 8d, these electron-hole pairs will be collected by the junctions in the same way that electron-hole pairs created by light absorption are collected in a p-n junction solar cell. A stack of p-n junctions will have an open-circuit voltage equal to the junction voltage of one junction times the number of junctions in the stack. For example, a stack of 30 p-n junctions in silicon may create an open-circuit voltage of 20 or more volts. The top and bottom of the junction stack is contacted with electrodes and these electrodes are connected to a membrane and counter electrode. The membrane will electrically charge and be discharged by the aforementioned deflection and contact with the counter electrode.

One advantage of the embodiments of FIGS. 8a-8d is that each of the p-n junctions will typically generate approximately 100 electron-hole pairs per interaction with the passing nuclear particle. Thus a single 5,000,000 volt electron may create a current of 1,000 electrons at the open circuit voltage of the p-n multijunction, which may be 50 volts or more. A 0.001 Curie nuclear source emits approximately $3.7*10^7$ particles per second. This charge, passing through the multijunction, may produce approximately $3.7*10^{10}$ charges per second at the required voltage needed to fully deflect the membrane. Thus, the embodiment of FIG. 8a reduces the amount of nuclear material needed to operate the device, or provides a means to increase the charging rate of the membrane as compared to the nuclear material alone.

FIG. 9a is a schematic cross sectional diagram of a self-powered microelectromechanical oscillator 912 having a flexible membrane layer 918 opposite of a nuclear substrate layer 920 and a protruded electrode 922 positioned between the layers to collect charge and store it in a battery 924 in accordance with one embodiment of the invention. The SPOMO 912 also includes circuitry 926 coupled to the nuclear layer electrode 920 and the protruded third electrode 922. The protruded electrode 922 may be formed by first depositing a thin layer of non-conducting oxide on the nuclear material and then depositing on this oxide a metal forming the protruded/third electrode 922. As can be seen in FIG. 9a, the protruded/third electrode 922 extends above the plane of the nuclear material. The protruded electrode 922 and oxide are lithographically patterned so that most of the area of the nuclear material is exposed to the membrane 918. That is, most of the nuclear decay products emitted from the nuclear material 920 will fall upon the membrane 918. As the membrane 918 is charged and deflects toward the nuclear layer 920, it will eventually come into contact with this third electrode 922. Electric charge can then be drained from the membrane 918 to the third electrode 922.

While a battery 924 and electronic circuit 926 are coupled across the third electrode 922 and the nuclear layer 920, a capacitor may be also be used. The battery and circuit ensure that the charge drained from the membrane can do useful work. For example, the battery may be charged by the membrane charge to a relatively low voltage such as 3 volts. This voltage is too low to maintain the deflection of the membrane but is more than sufficient to charge a lithium-ion or other battery. The energy stored in this battery is thus available to power other electronic circuits without significantly altering the operation of the membrane oscillator. In particular, the amplifier described in earlier embodiments could be powered by this battery. In several embodiments, it may be preferable that the size of the third electrode is adjusted so that the membrane has no tendency to stick to this electrode once the membrane is discharged.

In other embodiments, the battery/capacitor and circuitry can be replaced with a radio frequency transmitter circuit. In such case, when the charged membrane contacts the third electrode, the drained charge powers the RF circuit for as long as the charge is available. Thus the RF circuit may emit a radio frequency signal for a short period of time in concert with the periodic motion of the membrane. Thus, the embodiment with the radio frequency transmitter circuit provides a method for emitting a radio frequency signal according to the motion of the membrane and this transmission is also self powered by the SPOMO device. In another embodiment, the radio frequency transmitter circuit can be replaced with a light emitting diode enabling optical communication rather than RF communication.

FIG. 9b is a schematic cross sectional diagram of the self-powered microelectromechanical oscillator of FIG. 9a in a charging or actuation state in accordance with one embodiment of the invention.

FIG. 9c is a schematic cross sectional diagram of the self-powered microelectromechanical oscillator of FIG. 9a in a discharging state in accordance with one embodiment of the invention.

FIG. 9d is a schematic cross sectional diagram of the self-powered microelectromechanical oscillator of FIG. 9a in a relaxation or de-actuation state in accordance with one embodiment of the invention.

FIGS. 10a-10b are schematic cross sectional diagrams of a self-powered microelectromechanical oscillator 1012 illustrating an amplitude modulation method of interrogating the state of the oscillator in accordance with one embodiment of the invention. Generally all or most of the embodiments of the various SPOMO devices are amenable to their use in modulating light from a light source 1024 that may be reflected from the device, as seen in FIGS. 10a-10b, such that any deflection of the membrane 1018 will cause a redirection (1028) of incident light 1026 with the degree of deflection depending upon the deflection state of the membrane 1018. The membrane 1018 may act as a simple mirror that modulate the direction of reflected light, or may produce other effects such as multi-path interference between the membrane and the underlying nuclear material layer 1020. Thus the membrane motion can produce amplitude and frequency modulation of incident light.

FIG. 11a-11b are schematic cross sectional diagrams of a self-powered microelectromechanical oscillator 1112 illustrating a frequency modulation method of interrogating the state of the oscillator in accordance with one embodiment of the invention. The SPOMO 1112 includes the membrane 1118 and nuclear layer 1120.

In a number of embodiments, it would be possible to use the SPOMO as a tagging device where light was used to remotely interrogate the device state. A laser or other directional light source would illuminate the SPOMO from a distance and a remote optical receiver then used to detect modulations in the light reflected from the SPOMO surface. The frequency of the SPOMO oscillations may be used as an identifying characteristic of the SPOMO. Each SPOMO in a plurality of devices may be manufactured to have a unique mechanical oscillation frequency by adjusting the amount of nuclear material used, the membrane properties, the degree of control provided by any of the described parasitic control methods, and/or other methods known in the art. Thus a SPOMO may be detected through the use of a remote light source and identified from its mechanical motions. It is then apparent that an array of distinct SPOMO devices may be interrogated by the same light source and receiver so that multi-bit encodings of the array of devices may be obtained to provide more identifying information. Also, the modulations of the SPOMO characteristics by the parasitic controls provide a means to encode information from local sensors or other sources. These changes in the properties of the SPOMO may be remotely determined to provide, as an example, a remote monitoring of a local sensor value.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

For example, although most embodiments described above relate to the use of metallic materials, semi-metals and semi-conductive layers may also be used for one or more parts of the device structure. As another example, the nuclear layer and/or the membrane may have topologies designed to facilitate device operation for specific modes of operation. For example, the nuclear layer may be processed to have relief so that the deflected membrane will first contact a small area of the nuclear layer. This may be advantageous to control the arcing behavior of the charge recombination process. The membrane may be formed as a diffraction grating so that the angle of reflected light is wavelength dependent. Further, although most embodiments relate to a single device, arrays of SPOMO devices may be arranged to provide multiple characteristic frequencies to electronic circuitry or for modulating incident light.

What is claimed is:

1. A self powered microelectromechanical tagging or sensing system comprising:
a microelectromechanical oscillator having a characteristic frequency, the oscillator comprising:
a first substrate comprising a radioactive material configured to emit electrons; and
second substrate, spaced apart from the first substrate by first and second ends supported at spaced locations on the first substrate, wherein the second substrate comprises a flexible material and is configured to:
collect the electrons emitted from the first substrate; and
move toward the first substrate from a default position to an actuated position when a sufficient number of electrons have been collected;
wherein, in the actuated position, a plurality of the collected electrons are transferred from the second substrate to the first substrate;
a circuitry configured to receive, from the oscillator by wireless communication, information indicative of the characteristic frequency of the oscillator; and
a third substrate comprising a multi-layer of semiconductor p-n junctions, wherein a first surface of the third substrate is attached to a first surface of the first substrate, wherein a second surface of the first substrate faces the second substrate.

2. A self powered microelectromechanical tagging or sensing system comprising:
a microelectromechanical oscillator having a characteristic frequency, the oscillator comprising:
a first substrate comprising a radioactive material configured to emit electrons; and
a second substrate, spaced apart from the first substrate by first and second ends supported at spaced locations on the first substrate, wherein the second substrate comprises a flexible material and is configured to:
collect the electrons emitted from the first substrate; and
move toward the first substrate from a default position to an actuated position when a sufficient number of electrons have been collected; and
an electrode positioned between the first substrate and the second substrate;
wherein, in the actuated position, a plurality of the collected electrons are transferred from the second substrate to the electrode; and
a circuitry configured to receive, from the oscillator by wireless communication, information indicative of the characteristic frequency of the oscillator.

3. The system of claim 2, further comprising a storage circuitry coupled to the oscillator, wherein the storage circuitry is configured to store charge generated by the oscillator.

4. The system of claim 3, wherein the storage circuitry comprises a device selected from the group consisting of a battery and a capacitor.

5. The system of claim 2, further comprising a transmitter coupled to the oscillator, wherein the transmitter is configured to transmit energy generated by the oscillator.

6. The system of claim 2, wherein the characteristic frequency is a frequency determined by preselected structural characteristics of the oscillator.

7. The system of claim 2, further comprising a second circuitry coupled to the oscillator, wherein the second circuitry is configured to be excited at the characteristic frequency.

8. The system of claim 7, wherein the second circuitry comprises an amplifier configured to convert mechanical oscillations of the oscillator into electronic oscillations.

9. The system of claim 2, wherein the second substrate comprises a transparent material.

10. The system of claim 9:
wherein the circuitry comprises a circuitry for sending optical signals; and
wherein the microelectromechanical oscillator is configured to be interrogated by the circuitry.

11. The system of claim 2, further comprising a switch coupled to the first substrate and the second substrate.

12. The system of claim 11, wherein the switch is configured to enable and to disable the microelectromechanical oscillator.

13. The system of claim 2, further comprising a capacitor coupled between the first and second substrates, wherein the capacitor is configured to sense at least one environmental condition.

14. The system of claim 13, wherein the at least one environmental condition comprises a condition selected from the group consisting of humidity, temperature, ambient chemicals, and light.

15. The system of claim 2, further comprising a resistor coupled between the first and second substrates, wherein the resistor is configured to sense at least one environmental condition.

16. The system of claim 15, wherein the at least one environmental condition comprises a condition selected from the group consisting of humidity, temperature, ambient chemicals, and light.

17. The system of claim 2, wherein the second substrate comprises a reactive coating configured to sense at least one environmental condition.

18. The system of claim 17, wherein the at least one environmental condition comprises a condition selected from the group consisting of humidity, temperature, ambient chemicals, and light.

19. The system of claim 2, wherein the first substrate comprises an electrically conductive material, and wherein the second substrate comprises an electrically conductive material.

* * * * *